United States Patent
Ozaki et al.

(10) Patent No.: US 8,920,079 B2
(45) Date of Patent: Dec. 30, 2014

(54) JOINED PRODUCT

(75) Inventors: Kimihiro Ozaki, Nagoya (JP); Keizo Kobayashi, Nagoya (JP); Hideki Moriguchi, Itami (JP); Tomoyuki Ishida, Itami (JP); Akihiko Ikegaya, Itami (JP); Nobuyuki Kitagawa, Itami (JP)

(73) Assignees: National Institute of Advanced Industrial Science and Technology, Tokyo (JP); Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 1136 days.

(21) Appl. No.: 12/922,655

(22) PCT Filed: Mar. 27, 2009

(86) PCT No.: PCT/JP2009/056333
§ 371 (c)(1), (2), (4) Date: Sep. 14, 2010

(87) PCT Pub. No.: WO2009/123065
PCT Pub. Date: Oct. 8, 2009

(65) Prior Publication Data
US 2011/0020082 A1    Jan. 27, 2011

(30) Foreign Application Priority Data
Mar. 31, 2008   (JP) ................. 2008-093414

(51) Int. Cl.
*B24D 3/00*          (2006.01)
(Continued)

(52) U.S. Cl.
CPC ............... *B23K 1/19* (2013.01); *B23B 2240/08* (2013.01); *B23K 1/0004* (2013.01);
(Continued)

(58) Field of Classification Search
USPC ................... 407/119; 428/408, 469, 472, 698
See application file for complete search history.

(56) References Cited

U.S. PATENT DOCUMENTS 6,592,985 B2 * 7/2003 Griffin et al. ................. 428/332
7,462,003 B2 * 12/2008 Middlemiss ................. 407/119
(Continued)

FOREIGN PATENT DOCUMENTS

JP        53-001609         1/1978
JP        7156003 A         6/1995
(Continued)

OTHER PUBLICATIONS

Office Action issued in Japanese Patent Application No. 2010-505852 dated Jun. 3, 2013.
(Continued)

*Primary Examiner* — Will Fridie, Jr.
(74) *Attorney, Agent, or Firm* — Venable LLP; Michael A. Sartori; Tamatane J. Aga

(57) ABSTRACT

There is provided a joined product suitable as a cutting tool that is fit for high-speed cutting, CVD coating process and the like, and does not cause a reduction in joint strength of a joining layer even if a high temperature exceeding a temperature at which a brazing filler forms the liquid phase is reached during cutting. Specifically, the joined product includes a cemented carbide sintered compact serving as a first material to be joined and a cBN sintered compact or a diamond sintered compact serving as a second material to be joined. The first material to be joined and the second material to be joined are joined by a joining material that does not form a liquid phase at a temperature lower than 1000° C. and that is placed between the first material to be joined and the second material to be joined. The joining is performed by resistance heating and pressing at a pressure of 0.1 to 200 MPa.

10 Claims, 2 Drawing Sheets

(51) Int. Cl.
*B23K 1/19* (2006.01)
*B23K 1/00* (2006.01)
*B23K 35/30* (2006.01)
*B23K 35/00* (2006.01)
*C23C 16/00* (2006.01)
*B23K 35/32* (2006.01)
*B23K 20/16* (2006.01)
*B23K 20/02* (2006.01)
*E21B 10/26* (2006.01)

(52) U.S. Cl.
CPC ....... *B23B 2226/315* (2013.01); *B23K 35/3046* (2013.01); *B23B 2226/125* (2013.01); *B23K 35/005* (2013.01); *C23C 16/00* (2013.01); *B23K 35/3033* (2013.01); *B23K 35/325* (2013.01); *B23K 20/16* (2013.01); *B23K 20/021* (2013.01)
USPC .......................................... 407/119; 428/408

(56) References Cited

U.S. PATENT DOCUMENTS 7,828,088 B2 * 11/2010 Middlemiss et al. ......... 175/374
7,980,334 B2 * 7/2011 Voronin et al. ............... 175/428

FOREIGN PATENT DOCUMENTS

| JP | 11047923 A | 2/1999 |
| JP | 11294058 A | 10/1999 |
| JP | 11320218 A | 11/1999 |
| JP | 2002036008 A | 2/2002 |
| JP | 2004082151 A | 3/2004 |
| JP | 2009-241236 A | 10/2009 |

OTHER PUBLICATIONS

Igetalloy Cutting Tool ('07-'08 General Catalogue) issued by Sumitomo Electric Hardmetal Co., Oct. 2006, p. L4, Coated Sumiboron Series.

* cited by examiner

JOINED PRODUCT

TECHNICAL FIELD

The present invention relates to a joined product, and in particular, to a joined product suitable for a cutting tool.

BACKGROUND ART

A cutting tool having a tip to which a high hardness material is joined by brazing, as typified by a cBN (cubic boron nitride) or diamond cutting tool, has been conventionally manufactured and used for cutting processing of special steel and any other various materials.

Specifically, a tool formed by joining cBN and cemented carbide by brazing has been manufactured and sold, for example (e.g., Non-Patent Document 1). Alternatively, a joined product formed by joining PCD (sintered diamond) or cBN and ceramics or cermet by brazing has been proposed (e.g., Patent Documents 1 and 2). In addition, a cutting tool formed by joining cemented carbide or cermet and high-speed steel or the like by brazing with a Cu brazing filler has also been proposed (e.g., Patent Document 3).

Patent Document 1: Japanese Patent Laying-Open No. 2002-36008
Patent Document 2: Japanese Patent Laying-Open No. 11-320218
Patent Document 3: Japanese Patent Laying-Open No. 11-294058
Non-Patent Document 1: IGETALLOY Cutting Tool ('07-'08 General Catalogue) issued by Sumitomo Electric Hardmetal Co., October, 2006, p. L4, Coated SUMIBORON Series

DISCLOSURE OF THE INVENTION

Problems to be Solved by the Invention

In many brazing fillers, however, the liquid phase appears at approximately 700 to 800° C. Therefore, it has been difficult to apply a cutting tool that uses a product joined by brazing to high-speed cutting and the like during which the aforementioned temperature may be exceeded. In addition, the liquid phase formed during brazing may leak and contaminate a material to be joined in some cases, which may result in an adverse effect during processing that is the subsequent step.

Moreover, a coating process may be performed in some cases to enhance the wear resistance of the joined product. It has also been difficult, however, to perform the coating process that requires a high temperature exceeding the aforementioned temperature (e.g., a CVD coating requires 1000° C. or more).

In light of the above problems, an object of the present invention is to provide a joined product suitable as a cutting tool that is fit for high-speed cutting, CVD coating process and the like, and does not cause a reduction in joint strength of a joining layer even if a high temperature exceeding a temperature at which a brazing filler forms the liquid phase is reached during cutting.

Means for Solving the Problems

As a result of earnest study, the present inventors have found that the above problems can be solved by the invention.

A joined product comprises a cemented carbide sintered compact serving as a first material to be joined and a cBN sintered compact or a diamond sintered compact serving as a second material to be joined. The first material to be joined and the second material to be joined are joined by a joining material that does not form a liquid phase at a temperature lower than 1000° C. and that is placed between the first material to be joined and the second material to be joined. Joining by the joining material is performed by resistance heating and pressing at a pressure of 0.1 to 200 MPa.

The first material to be joined formed of the cemented carbide sintered compact and the second material to be joined formed of the cBN sintered compact or the diamond sintered compact are joined by the joining material that does not form the liquid phase at a temperature lower than 1000° C. and that is placed between the first material to be joined and the second material to be joined. Therefore, when this joined product is used as a cutting tool for cutting operation, the joining layer does not form the liquid phase and the joint strength is not reduced even if a high temperature exceeding 800° C. is reached during the cutting operation. Accordingly, there can be provided a cutting tool and the like suitable for high-speed cutting during which the temperature reaches 1000° C. or more.

In addition, this allows CVD coating and the like in which the joined product is coated at the temperature of approximately 1000° C. Therefore, the CVD coating to a cBN tool and a diamond tool, to which the CVD coating has not been applicable conventionally, becomes possible, for example, which allows coping with a further extended life and many kinds of materials to be cut. It is noted that, in this case, the joining layer is preferably a layer that does not form the liquid phase at a temperature slightly higher than the temperature of the CVD coating. This is because deformation of the joining layer due to a rapid change and the like in temperature during the CVD coating, and further, an impact on reduction in joint strength can be lessened.

Since the cBN sintered compact or the diamond sintered compact serving as the second material to be joined is vulnerable to heat and is readily decomposed at a high temperature, the cBN sintered compact or the diamond sintered compact is susceptible to thermal degradation within a short time. Therefore, it has been difficult to obtain the joined product of the first material to be joined and the second material to be joined by brazing joining through the use of the joining material that forms the liquid phase at a temperature equal to or higher than 1000° C.

However, since joining is performed by resistance heating with the pressing force of 0.1 to 200 MPa applied between the first material to be joined and the second material to be joined, firm joining can be obtained within an extremely short time of several seconds to several minutes. Consequently, the cBN sintered compact or the diamond sintered compact that is a high-pressure-stable-type material can be joined to the cemented carbide by using the joining material that does not form the liquid phase at a temperature lower than 1000° C., without degradation in quality of the cBN sintered compact or the diamond sintered compact.

Excessively weak pressing force causes a problem such as an increase in contact resistance between electrodes and the cBN sintered compact or the diamond sintered compact and the cemented carbide sintered compact that serve as the materials to be joined, and a current does not flow or electrical discharge occurs. On the other hand, excessively strong pressing force causes a problem such as deformation of the cBN sintered compact and the cemented carbide sintered compact. In the invention according to claim 1, since the preferable pressing force is 0.1 to 200 MPa, these problems do not arise and the preferable joined product can be obtained.

The pressing force of 1 to 100 MPa is preferable because appropriate contact resistance is obtained and heat is efficiently generated at the joint surface. The pressing force of 10 to 70 MPa is more preferable because more appropriate contact resistance is obtained and deformation of the material to be joined becomes difficult.

By the resistance heating, the first material to be joined generates heat and is joined more preferentially than the second material to be joined.

The cemented carbide sintered compact serving as the first material to be joined generates heat and is joined more preferentially than the cBN sintered compact or the diamond sintered compact serving as the second material to be joined. Generally, the cBN sintered compact or the diamond sintered compact has the electrical resistance higher than that of the cemented carbide sintered compact. Therefore, during resistance heating, the cBN sintered compact or the diamond sintered compact serving as the second material to be joined generates heat more preferentially than the cemented carbide sintered compact serving as the first material to be joined, which may lead to degradation in quality (thermal degradation, decomposition, generation of cracks, and the like) of the cBN sintered compact or the diamond sintered compact.

In order to prevent the occurrence of such degradation in quality of the second material to be joined, it is necessary to devise arrangement of the second material to be joined and the joining material as well as a conduction method such that the first material to be joined generates heat more preferentially than the second material to be joined during resistance heating. Specifically, this includes, for example, the use of different materials for the electrode that is in contact with the second material to be joined and the electrode that is in contact with the first material to be joined. By the use of the different materials for the electrodes, heat generation of each of the first material to be joined and the second material to be joined can be controlled because the amount of current flowing through the first material to be joined is different from the amount of current flowing through the second material to be joined. In addition, the second material to be joined may be indirectly heated by more intensive resistance heating of the first material to be joined than the second material to be joined.

In this manner, by devising a conduction path, the first material to be joined can be heated more preferentially than the second material to be joined. Consequently, a portion in the proximity of the joining material can be heated to a high temperature within a short time, more specifically within one minute, for example, and preferably within 30 seconds, without heating the cBN sintered compact or the diamond sintered compact serving as the second material to be joined to a higher temperature than required. Therefore, firm joining becomes possible and the properties of the cBN sintered compact or the diamond sintered compact such as high hardness can be made full use of without degradation in quality (thermal degradation, decomposition, generation of cracks, and the like) of the cBN sintered compact or the diamond sintered compact.

By the resistance heating, at least one element of components of the joining material is diffused into the first material to be joined and/or the second material to be joined.

Since at least one element of the components of the joining material is diffused into the first material to be joined and/or the second material to be joined, the first material to be joined and the second material to be joined can be joined more efficiently, and the joined product having higher joint strength can be obtained.

The joining material that deforms by resistance heating and pressing is used for joining.

Since the joining material that deforms by resistance heating and pressing is used, movement of substances along with the deformation of the joining material acts effectively on binding of an interface between the material to be joined and the joining material, and the joined product having high joint strength can be obtained. In addition, since the joining material deforms in accordance with the shape of the material to be joined by resistance heating and pressing, the bonding area can be increased and an effect of enhancing the joint strength can be obtained.

The joining material is made of any one of titan (Ti), cobalt (Co) and nickel (Ni), or an alloy including at least one of titan (Ti), cobalt (Co) and nickel (Ni).

The joining material is generally used as a binder phase component of the cemented carbide sintered compact serving as the first material to be joined and the cBN sintered compact or the diamond sintered compact serving as the second material to be joined. In addition, the joining material includes at least any one of Ti, Co and Ni that form the liquid phase at a temperature equal to or higher than 1400° C. Therefore, the joined product having higher joint strength can be obtained.

The joining material includes titan (Ti).

The material including Ti that is used as the binder phase component of the cBN sintered compact or the diamond sintered compact serving as the second material to be joined is used as the joining material. Therefore, Ti in the joining material is readily diffused into the first material to be joined and the second material to be joined, and firm joining can be obtained. Furthermore, the use of a material that combines with Ti to form an intermetallic compound allows further increase in temperature at which the joining material forms the liquid phase and increase in strength. Therefore, the use of the joining material including Ti is preferable.

An element that combines with Ti to form the intermetallic compound can include, for example, Si. The intermetallic compound may be originally included in the joining material. In addition, the element that configures the intermetallic compound may be included in the joining material in a different state, and the intermetallic compound may be reactively formed after joining is completed. When the intermetallic compound is reactively formed, heat of the reaction can be used for joining, and thus, reactive formation of the intermetallic compound is more effective in joining.

The joining material forms the liquid phase at a temperature lower than a temperature at which the first material to be joined forms the liquid phase.

Since the joining material forms the liquid phase at a temperature lower than the temperature at which the first material to be joined forms the liquid phase, the joined product deforms during resistance heating and pressing before the first material to be joined deforms significantly. Therefore, joining can be performed while preventing a change in shape of the first material to be joined due to joining. Such joining material can include, for example, a Ti—Co alloy, a Ti—Ni alloy and the like.

At least part of the joining material forms the liquid phase during resistance heating. Therefore, the elements of the components of the joined product are readily diffused into the first material to be joined and the second material to be joined, and the first material to be joined and the second material to be joined can be firmly joined.

A binder phase of the joining material and/or the first material to be joined has a nickel (Ni) content of 30 vol % (percentage by volume) or less. It is noted that the binder phase herein refers to an alloy phase included in the first material to be joined. More specifically, the binder phase refers to a phase made of an iron group metal that binds WC and the like that is a hard phase, in the cemented carbide sintered compact serving as the first material to be joined.

The binder phase of the joining material and/or the first material to be joined has a nickel (Ni) content of 30 vol % or less. This is because, when the nickel content exceeds 30 vol %, there is a high possibility that the joining material and the first material to be joined react with chlorine gas used as a CVD coating material and a CVD film grows abnormally when the CVD coating is applied to the joined product.

The joining material is provided on a surface of the first material to be joined and/or the second material to be joined, by a plating method.

The joining material is provided on the surface of the first material to be joined and/or the second material to be joined, by the plating method. Therefore, the thickness of the joining material is readily controlled and the quality can be stabilized, as compared with a case where the joining material is applied in the form of powder or paste. Furthermore, when the invention is applied to mass production of the joined product, automation of steps is easy, and thus, the joined product is preferable in terms of cost and stabilization of quality.

The joining material is provided on a surface of the first material to be joined and/or the second material to be joined, by a physical vapor deposition method.

The joining material is provided on the surface of the first material to be joined and/or the second material to be joined, by the physical vapor deposition method. Therefore, the thickness of the joining material is readily controlled and the quality can be stabilized, as compared with the case where the joining material is applied in the form of powder or paste. Furthermore, when the invention is applied to mass production of the joined product, mechanization and automation are easy, and thus, the joined product is preferable in terms of cost and stabilization of quality. Film forming by a sputtering method or an arc vapor deposition method is especially preferable.

The joined product is a cutting tool.

Since the joined product includes, as the materials to be joined, the cemented carbide sintered compact serving as the first material to be joined and the cBN sintered compact or the diamond sintered compact serving as the second material to be joined, the joined product obtained by joining the first material to be joined and the second material to be joined by the above joining material can be suitably used as the cutting tool. The cutting tool includes the following types: a cutting insert shown in FIG. 1, and a rotating tool such as a drill, an end mill and a reamer. In the present invention, there can be provided a cutting tool that does not cause a reduction in joint strength of the joining material even in high-speed cutting during which the temperature at which the brazing filler forms the liquid phase is exceeded.

As described above, in the present invention, there can be provided a tool that can make full use of the properties of the cBN sintered compact or the diamond sintered compact such as high hardness without degradation in quality (thermal degradation, decomposition, generation of cracks, and the like) of the cBN sintered compact or the diamond sintered compact that is a high-pressure-stable-type material. In particular, the tool of the present invention is preferable because the tool can be suitably provided as a tool such as a wear resistant tool, a mine and civil engineering tool, and a cutting tool.

In addition, in the present invention, the second material to be joined can be joined to the first material to be joined, without necessarily requiring a back metal (a thin cemented carbide layer provided on the opposite side of a cut surface). A joined product of the first material to be joined and the second material to be joined that has the back metal, however, is not excluded from the present invention.

Effects of the Invention

According to the present invention, there can be provided a joined product suitable as a cutting tool that is fit for high-speed cutting, CVD coating process and the like, and does not cause a reduction in joint strength of a joining layer even if a high temperature exceeding a temperature at which a brazing filler forms the liquid phase is reached during cutting as in the conventionally art.

DESCRIPTION OF THE REFERENCE SIGNS 1 first material to be joined; 2 joining material; 3 second material to be joined; 4, 6, 7, 8 electrode; 5 split electrode

BEST MODES FOR CARRYING OUT THE INVENTION

The best embodiments for carrying out the present invention will be described hereinafter based on the examples that will be described below. It is noted that the present invention is not limited to the following embodiments. Various modifications can be made to the following embodiments within the scope that is the same as and equivalent to that of the present invention.

(As to Conduction in Joining by Resistance Heating and Pressing)

First, manners of conduction in joining by resistance heating and pressing will be described by using the figures.

1. First Manner of Conduction

Figure 1:
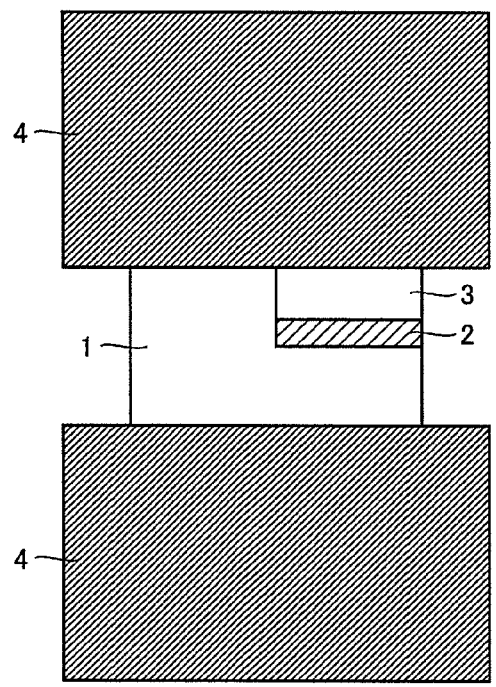
FIG. 1 is a conceptual view illustrating one manner of conduction in joining by resistance heating and pressing.

In FIG. 1, materials 1 and 3 to be joined are a first material to be joined (a cemented carbide sintered compact) and a second material to be joined (a cBN sintered compact or a diamond sintered compact), respectively, and materials 1 and 3 to be joined are joined by means of a joining material 2 sandwiched therebetween.

Specifically, materials 1 and 3 to be joined and joining material 2 are sandwiched by electrodes (graphite) 4. Pressure is applied to materials 1 and 3 to be joined, joining material 2 and electrodes 4, and a current is passed through electrodes 4. Since electrodes 4 span both material 1 to be joined and material 3 to be joined, an electrical circuit can be formed, by which a current sufficient for joining is passed through the material to be joined that has lower electrical resistance, even when any one of the materials to be joined has high electrical resistance.

A material that does not form the liquid phase at a temperature lower than 1000° C. by resistance heating is used as joining material 2. Here, it is desirable that the material has the properties described herein.

The passage of the current through electrodes 4 causes resistive heat generation of materials 1 and 3 to be joined and joining material 2, and as a result, materials 1 and 3 to be joined are joined. It is noted that two electrodes 4 are, as a matter of course, made of a material having conductivity and are desirably made of a material that does not react with materials 1 and 3 to be joined, and further, joining material 2. Even when two electrodes 4 are made of a material that reacts with materials 1 and 3 to be joined and joining material 2, reaction with the electrodes can be suppressed by arranging a carbon sheet between electrodes 4 and materials 1 and 3 to be joined.

2. Second Manner of Conduction

Figure 2:
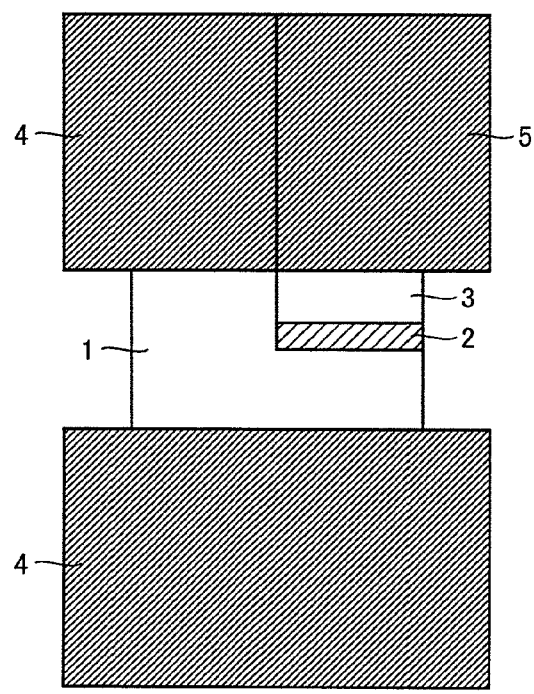
FIG. 2 is a conceptual view illustrating another manner of conduction in joining by resistance heating and pressing.

In FIG. 2, a split electrode 5 is in contact with second material 3 to be joined, and electrode 4 is in contact with first material 1 to be joined. By using different materials for electrode 4 and split electrode 5, the electrical conductivity and the thermal conductivity thereof can be changed. In addition, different currents can be applied to the first material to be joined and the second material to be joined, respectively, and the temperature thereof can be extremely changed. As a result, even a material to be joined that is prone to thermal degradation can be joined without thermal degradation. Furthermore, by splitting the electrode and pressing each electrode independently, the pressure applied to the first material to be joined and the second material to be joined can be controlled with high precision, and thus, the joint strength can be enhanced. Therefore, splitting of the electrode is preferable.

3. Third Manner of Conduction

Figure 3:
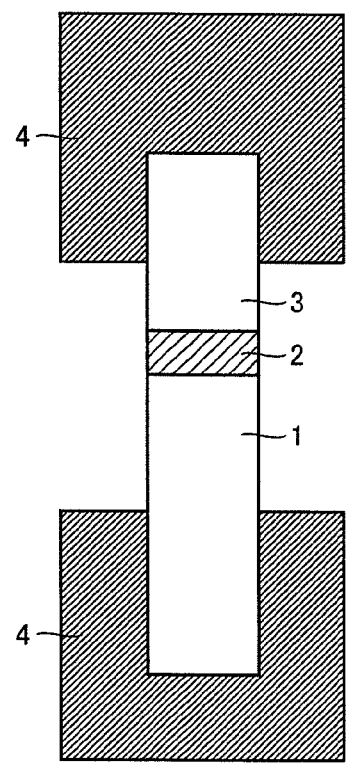
FIG. 3 is a conceptual view illustrating one manner in joining by resistance heating and pressing of a rotating tool.

In FIG. 3, material 1 to be joined and material 3 to be joined are arranged with joining material 2 interposed therebetween, and the electrodes are in contact with the respective materials to be joined. By applying a voltage between the electrodes, a current passes through the materials to be joined and the joining material, which causes heating, thereby joining material 1 to be joined and material 3 to be joined. In order to pass a current sufficient for heating, it is preferable that the electrode is in contact with the material to be joined as close as possible. When material 3 to be joined has high electrical resistance, a material having low electrical resistance is added in advance to a part of material 3 to be joined. As a result, a current path can be ensured and the current sufficient for joining can be passed. It is preferable that the electrode is in close contact with the material to be joined.

4. Fourth Manner of Conduction

Figure 4:
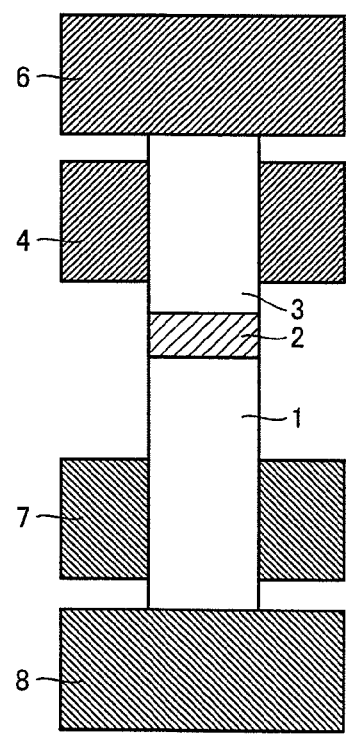
FIG. 4 is a conceptual view illustrating another manner in joining by resistance heating and pressing of the rotating tool.

In FIG. 4, material 1 to be joined and material 3 to be joined are arranged with joining material 2 interposed therebetween, and the electrodes are in contact with the respective materials to be joined. The electrodes are divided into an electrode 6 and an electrode 8 for both conduction and pressing, and electrode 4 and an electrode 7 mainly for conduction. As a result, even when the material to be joined has high electrical resistance, a current can be preferentially passed from electrode 4 and electrode 7 through a portion of the material to be joined to which the material having low electrical resistance has been added, and only a portion that requires pressing and heating can be pressed and heated. It is noted that electrode 6 may be in contact with electrode 4 and electrode 8 may be in contact with electrode 7. In addition, a current may not be passed through electrode 6 and electrode 8. Furthermore, independent adjustment of the position of electrode 4 and electrode 7 as well as the amount of current passing through electrode 4 and electrode 7 is preferable because the independent adjustment allows coping with a change in shape and properties. Moreover, electrodes 4, 6, 7, and 8 may be all made of the same material, may be partially made of different materials, or may be all made of different materials. Alternatively, only a portion that is in contact with the material to be joined may be made of a different material.

(As to Joining Through the Use of Joining by Resistance Heating and Pressing)

Next, joining by resistance heating and pressing through the use of conduction shown in above FIG. 1 or 2 will be described.

Conduction conditions are determined as appropriate depending on the materials and the like of the used material to be joined and the used joining material. It is preferable that the conduction time is within approximately 30 seconds so as not to cause deformation or melting of the material of the material to be joined as well as bulking of particles in a portion other than a portion in the proximity of the joining material.

As a manner of the joining material for joining by resistance heating and pressing, a method for coating the first material to be joined and the second material to be joined by a plating method or a physical vapor deposition method can be employed, in addition to a method for applying the joining material in the form of powder or paste onto the surface of the first material to be joined and/or the second material to be joined. The method for coating the first material to be joined and the second material to be joined by the plating method or the physical vapor deposition method is especially preferable for stabilization of the joint strength because the method facilitates handling of the materials to be joined after the materials to be joined are coated with the joining material, is advantageous in automation of the joining step, and facilitates control over the thickness of a coating film.

By resistance heating and pressing, the joining material readily deforms, adhesion between the joining material and the material to be joined is enhanced, and element diffusion readily occurs. Consequently, the joint strength can be dramatically enhanced. In particular, when the joined product of the present invention is applied to a cutting tool, for example, a cutting insert, a joint surface of the first material to be joined that serves as a base material and the second material to be joined points in two directions of the vertical direction and the horizontal direction in FIG. 1, and it is necessary to tightly join the first material to be joined and the second material to be joined in both directions. In this case, pressing from the two directions is preferable.

Excessively weak pressing force is inappropriate because the pressing force causes an increase in the contact resistance between the electrode and the material to be joined and a current cannot be passed or electrical discharge occurs. Excessively strong pressing force is also inappropriate because the pressing force causes deformation of the cemented carbide sintered compact. In the present invention, the pressing force of 0.1 to 200 MPa is appropriate.

As an atmosphere during joining, joining in a vacuum or in inert gas or in a reducing atmosphere is desirable, because both of the material to be joined and the joining material include a metal. Although the degree of vacuum is not particularly limited, it is desirable that the degree of vacuum is higher than 13.3 Pa (0.1 Torr). The inert gas can include argon, helium, nitrogen, or a mixed gas thereof. The reducing atmosphere can include a gas atmosphere in which a small proportion of hydrogen gas is mixed with the above inert gas, and a method for placing heated graphite in the proximity of the material to be joined.

As a manner of the current that is passed through, a direct current and an alternating current can be both used if the current allows heating of the material to be joined and the joining material to an appropriate temperature. In particular, since the peak current value and the ratio between ON and OFF of the pulse of a pulsed direct current can be changed, a joint interface can be instantaneously heated and the overall temperature control range of the material to be joined can be widened. Therefore, the pulsed direct current is effective in joining Examples 1 to 6 and Comparative Examples 1 and 2

The present examples and comparative examples are related to the relationship among the pressing force, the joint strength and deformation of the material to be joined during joining.

As shown in FIG. 1, a cBN insert (second material to be joined) with a triangular back metal having a surface coated with Ni plating of a thickness of 10 μm was set on a base (first material to be joined) made of cemented carbide and having a counterbore, and joining by resistance heating and pressing was performed in a vacuum in a state where the pressures of 0.05 MPa (Comparative Example 1), 0.1 MPa (Example 1), 10 MPa (Example 2), 30 MPa (Example 3), 70 MPa (Example 4), 100 MPa (Example 5), 200 MPa (Example 6), and 250 MPa (Comparative Example 2) were applied in the vertical direction, respectively. As a result, joined products of Examples 1 to 6 and Comparative Examples 1 and 2 were obtained. It is noted that graphite was used as an electrode and a graphite sheet was inserted between the electrode and the material to be joined in order to prevent reaction with the electrode. The pulsed direct current was passed through under the conditions of 2000 A of the pulsed current value, 1:1 of the ratio between ON and OFF of the pulse, 10 ms of the pulse width, 10 seconds of the conduction time, and 0.98 kN of the load. It is noted that two types of WC-5% Co (a material A to be joined) and WC-10% Co (a material B to be joined) (both are expressed in wt % (percentage by mass)) were used as the base (first material to be joined) made of cemented carbide.

The joint strength (shear fracture strength) of each of the obtained joined products was measured, and in addition, the presence or absence of deformation of each material to be joined in the proximity of a joining layer was observed. The result is shown in Table 1.

material to be joined. When the pressing force was extremely low (Comparative Example 1), however, joining did not occur, and when pressing was performed at the pressing force exceeding 200 MPa (Comparative Example 2), deformation occurred at the material to be joined in the proximity of the joining layer, regardless of the composition of the material to be joined. Consequently, it was confirmed that the preferable pressing force was 0.1 to 200 MPa in the present invention.

Example 7

Next, a Ti-30 wt % Co layer (joining material) having a thickness of 10 μM was provided at the cBN (second material to be joined) with the back metal by using, instead of plating, a sputtering method that is the physical vapor deposition method, and the cBN was joined to the cemented carbide base (first material to be joined). At this time, aforementioned material A to be joined and material B to be joined were used as the cemented carbide base (first material to be joined), and the joining conditions were the same as those of Example 3. Consequently, it was confirmed that the cBN and the cemented carbide were joined without any void, with the Ti—Co layer interposed therebetween. This is supposed to be because the liquid phase was formed during joining. It is noted that the joint strength of material A to be joined was 310 MPa and the joint strength of material B to be joined was 325 MPa.

Next, the joined product of Example 3 and the joined product of Example 7 in which materials A and B were used as the first material to be joined underwent grinding processing with a diamond grindstone, respectively, and then, were coated with TiCN and alumina each having a thickness of 2 μm at the coating temperature of 1000° C. by using the known CVD method, and growth of a CVD film was observed. Consequently, in the joined product of Example 3 in which

TABLE 1

| Sample | Comparative Example 1 | Example 1 | Example 2 | Example 3 | Example 4 | Example 5 | Example 6 | Comparative Example 2 |
|---|---|---|---|---|---|---|---|---|
| Pressing Force (MPa) | 0.05 | 0.1 | 10 | 30 | 70 | 100 | 200 | 250 |
| Joint Strength of A (MPa) | not joined | 120 | 135 | 320 | 330 | 320 | 400 | unmeasurable |
| Joint Strength of B (MPa) | not joined | 125 | 140 | 330 | 350 | 300 | unmeasurable | unmeasurable |
| Deformation of Material A to be Joined | not deformed | not deformed | not deformed | not deformed | not deformed | not deformed | not deformed | deformed |
| Deformation of Material B to be Joined | not deformed | not deformed | not deformed | not deformed | not deformed | not deformed | deformed | deformed |

As shown in Table 1, when the pressing force was 0.1 to 100 MPa (Examples 1 to 5), the strength equal to that of a conventional brazed product was obtained and deformation of the material to be joined was not recognized. In addition, when the pressing force was 100 to 200 MPa, deformation was not recognized depending on the composition of the the joining material was Ni, abnormal growth of the CVD film was seen regardless of the type of the first material to be joined. On the other hand, in the joined product of Example 7 in which the joining material was not Ni but Ti—Co, abnormal growth of the CVD film was not seen regardless of the type of the first material to be joined.

Example 8

Next, a material (joining material) formed by dissolving Ti powders in a solvent was applied to the cemented carbide base (material A to be joined: first material to be joined), and a cBN chip (second material to be joined) without the back metal was set, and joining by resistance heating and pressing was performed under the same conduction conditions as those of Example 3. It was confirmed that the joint strength of this joined product was 250 MPa, which was equal to that of the conventional brazed product. A dense Ti layer having a thickness of 20 μm was observed in this joint portion, and it was confirmed that the Ti powders were melted or sintered.

Example 9

Next, based on above Example 8, for the purpose of shortening the conduction time, the conduction time among the conditions described in Example 8 was changed to determine the joining conditions. Consequently, when the conduction time was changed from 10 seconds in Example 8 to 8 seconds, excellent joining was possible at a current whose pulsed current value is larger by 200 A than the current value (2000 A) described in Example 8. Furthermore, when the conduction time was changed to 6 seconds, excellent joining was possible by further increasing the pulsed current by 200 A.

Example 10

Next, in order to achieve accurate joining at a back surface of the cBN (second material to be joined) as well, joining was performed while pressure was applied from two directions. The pressure was applied in the vertical direction by the upper and lower electrodes as in the above-described examples, and a load was separately applied from the side to allow pressing of the cBN in the horizontal direction. It is noted that material A to be joined was used as the first material to be joined. The cBN coated with the Ni plating that is the same as the cBN used in Example 3 was used, and joining was performed under the conditions of 3000 A of the pulsed current, 1:4 of the ratio between ON and OFF of the pulse, and 10 seconds of the conduction time.

Consequently, not only the bottom surface but also the back surface of the cBN was joined to the cemented carbide base with a Ni layer interposed therebetween. The joint strength at this time was 340 MPa, and the joint strength higher than the joint strength obtained during pressing only in the vertical direction was obtained.

Example 11

Next, the upper electrode of the electrodes for resistance heating and pressing was split, and different materials were used for the electrode for pressing the cemented carbide base (material A to be joined: first material to be joined) and the electrode for pressing the cBN (second material to be joined). As a result, a current flowing through the electrodes is changed and the value of the current flowing through the cemented carbide base and the cBN is also changed. Consequently, the temperature of the cemented carbide base and the cBN can be extremely changed and the temperature of the cBN, in which degradation at a high temperature is a concern, can be reduced.

Graphite was used as the electrode for resistance heating and pressing of the cemented carbide base, and hBN was used as the electrode for resistance heating and pressing of the cBN. The hBN is an electrically-insulated material and little current flows through the hBN. The plated cBN was used. An experiment was conducted under the conditions of 2000 A of the pulsed current, 1:1 of the ratio between ON and OFF of the pulse, 10 ms of the pulse width, 10 seconds of the conduction time, and 0.98 kN of the load, and as a result, the cBN was able to be joined without thermal degradation. This is supposed to be because little current flew through the cBN and the cBN itself did not cause joule heat generation while the cemented carbide base was preferentially heated, thereby allowing joining of the cBN without increasing the temperature thereof. It is noted that the joint strength was 200 MPa, which was equal to that of the conventional brazed product.

Example 12

A joined product was obtained similarly to Example 11, except that an unsplit electrode was used as the upper electrode. The joint strength of the obtained joined product was 350 MPa, which was equal to the joint strength of the conventional brazed product and higher than the joint strength in Example 11. A part of the cBN of the obtained joined product, however, had cracks and degradation in quality due to heat was seen.

Based on the results of Examples 11 and 12, it was confirmed that the joined product having high joint strength without thermal degradation of the cBN (second material to be joined) was able to be obtained by controlling electric power supply to the cBN (second material to be joined) and preferentially heating the cemented carbide (first material to be joined).

Example 13

Next, the electrode for pressing the cBN (second material to be joined) was made of a conductive material, instead of the insulating hBN described in Example 11. Here, a material having the electrical conductivity higher than that of the electrode for pressing the cemented carbide base (first material to be joined) was used. As a result, a current flowing through the cemented carbide base and the cBN was able to be changed, such that the current flowing through the cemented carbide base was able to heat the base in the proximity of the cBN and the current flowing through the cBN was able to preferentially heat the joining material.

Specifically, the current of about 2000 A was passed through the cemented carbide base and the current of about 1000 A was passed through the cBN (the current values are estimated values) for joining by resistance heating and pressing. At this time, a difference between the depth of the counterbore of the cemented carbide base and the height of the cBN was 0.1 mm, and by using the split electrode, pressing of both the cemented carbide base and the cBN was possible even when a gap was large. As a result of conduction, firm joining was possible without degradation of the cBN.

The invention claimed is:

1. A joined product comprising a cemented carbide sintered compact serving as a first material to be joined and a cBN sintered compact or a diamond sintered compact serving as a second material to be joined, said first material to be joined and said second material to be joined being joined by a joining material that does not form a liquid phase at a temperature lower than 1000° C. and that is placed between said first material to be joined and said second material to be joined, and joining by said joining material being performed by resistance heating and pressing at a pressure of 0.1 to 200 MPa, wherein by said resistance heating, said first material to be joined generates heat and is joined more preferentially than said second material to be joined, wherein a binder phase of said joining material and/or said first material to be joined has a nickel content of 30 vol % (percentage by volume) or less.

2. The joined product according to claim 1, wherein by the resistance heating, at least one element of components of said joining material is diffused into said first material to be joined and/or said second material to be joined.

3. The joined product according to claim 1, wherein the joining material that deforms by resistance heating and pressing is used for joining.

4. The joined product according to claim 1, wherein said joining material is made of any one of titan, cobalt and nickel, or an alloy including at least one of titan, cobalt and nickel.

5. The joined product according to claim 4, wherein said joining material includes titan.

6. The joined product according to claim 1, wherein said joining material forms the liquid phase at a temperature lower than a temperature at which said first material to be joined forms the liquid phase.

7. The joined product according to claim 6, wherein at least a part of said joining material forms the liquid phase during resistance heating.

8. The joined product according to claim 1, wherein said joining material is provided on a surface of said first material to be joined and/or said second material to be joined, by a plating method.

9. The joined product according to claim 1, wherein said joining material is provided on a surface of said first material to be joined and/or said second material to be joined, by a physical vapor deposition method.

10. The joined product according to claim 1, wherein said joined product is a cutting tool.

* * * * *